(12) United States Patent
Wong (10) Patent No.: US 6,368,416 B1
(45) Date of Patent: Apr. 9, 2002

(54) METHOD FOR VALIDATING PRE-PROCESS ADJUSTMENTS TO A WAFER CLEANING SYSTEM

(75) Inventor: Larry Ping-Kwan Wong, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/345,398

(22) Filed: Jul. 1, 1999

(51) Int. Cl.$^7$ ................................. B08B 7/00
(52) U.S. Cl. ............................ 134/6; 134/9
(58) Field of Search ................ 134/6, 7, 9, 26, 134/32, 33, 34, 36, 42

(56) References Cited

U.S. PATENT DOCUMENTS

| | | | |
|---|---|---|---|
| 4,569,695 A | * 2/1986 | Yamashita et al. | 134/1 |
| 5,639,311 A | * 6/1997 | Hollyey et al. | 134/6 |
| 5,723,019 A | * 3/1998 | Krusell et al. | 134/6 |
| 5,806,126 A | * 9/1998 | de Larios et al. | 134/6 |
| 5,858,109 A | * 1/1999 | Hymes et al. | 134/6 |

FOREIGN PATENT DOCUMENTS

JP           63-228624        9/1988

\* cited by examiner

*Primary Examiner*—Randy Gulakowski
*Assistant Examiner*—Saeed Chaudhry
(74) *Attorney, Agent, or Firm*—Martine & Penilla, LLP (57) ABSTRACT

A method for validating pre-process adjustments to a wafer cleaning system includes the operations of (a) making pre-process adjustments to a wafer cleaning system, (b) loading a substantially transparent wafer into the wafer cleaning system, and (c) observing the substantially transparent wafer as the substantially transparent wafer moves along a wafer transfer path in the wafer cleaning system. In the event undesirable contact between the substantially transparent wafer and components of the wafer cleaning system is observed, the method further includes (d) making adjustments to the wafer cleaning system formulated to avoid undesirable contact between semiconductor wafers to be processed and components of the wafer cleaning system, and (e) repeating operations (b) through (d) until the substantially transparent wafer moves along the wafer transfer path without undesirable contact with components of the wafer cleaning system. The method also may include observing the substantially transparent wafer to confirm that liquid sprayed from below the wafer during rinsing operations properly contacts the bottom side of the wafer.

15 Claims, 7 Drawing Sheets

METHOD FOR VALIDATING PRE-PROCESS ADJUSTMENTS TO A WAFER CLEANING SYSTEM

BACKGROUND OF THE INVENTION

The present invention relates generally to semiconductor fabrication and, more particularly, to a method for validating pre-process adjustments to a wafer cleaning system.

In the fabrication of semiconductor devices, a variety of wafer preparation operations are performed. The goal of some of these wafer preparation operations is to remove unwanted residual material from the surface of a wafer after fabrication operations such as, for example, plasma etching and chemical mechanical planarization (CMP). As is well known to those skilled in the art, any unwanted residual material left on the surface of the wafer for subsequent fabrication operations may cause defects that render devices on the wafer inoperable. Consequently, effective wafer preparation operations are essential to obtaining a high yield rate.

Figure 1A:
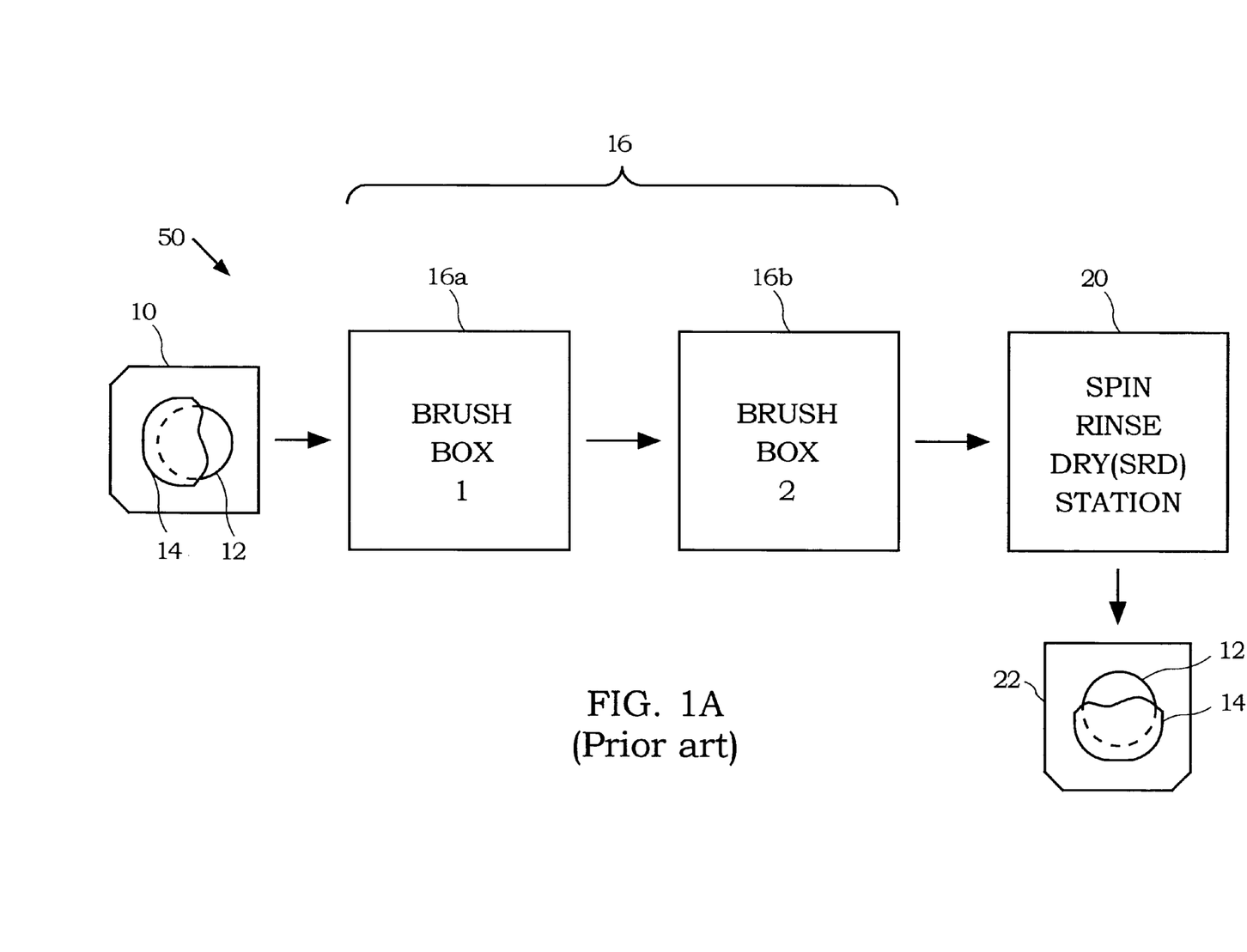
FIG. 1A shows a schematic diagram of a conventional wafer cleaning system.

FIG. 1A shows a schematic diagram of a conventional wafer cleaning system 50. The cleaning system 50 includes a load station 10 where a plurality of wafers in a cassette 14 may be inserted into the system for cleaning. Once the wafers are inserted into the load station 10, a wafer 12 may be taken from the cassette 14 and moved into a brush station 16, which includes a first brush box 16a and a second brush box 16b. The wafer 12 is first moved into first brush box 16a, where the wafer is scrubbed in a solution containing specified chemicals and deionized (DI) water. The wafer 12 is then moved into second brush box 16b, where the wafer is again scrubbed in a solution containing specified chemicals and DI water. After the wafer 12 has been scrubbed in brush boxes 16a and 16b, the wafer is moved into a spin, rinse, and dry (SRD) station 20 where DI water is sprayed onto the top and bottom surfaces of the wafer as the wafer is spun. After the wafer 12 has been dried, the wafer is moved from SRD station 20 to an unload station 22.

Until recently, efforts to control wafer contamination have focused primarily on the top side of wafers. As the semiconductor industry moves to larger, e.g., 300 mm, wafers and to smaller, e.g., 0.18 $\mu$m and smaller, feature sizes; however, it is becoming increasingly more important to control wafer contamination on both the top and bottom sides of wafers. One way that wafers can be exposed to particulate contamination is through contact with mechanical components of the brush station as the wafers move along the wafer transfer path. In an effort to avoid such undesirable contact, pre-process adjustments are made to the mechanical components of the brush station before the processing of wafers begins. These pre-process adjustments are formulated to set the clearances between the mechanical components of the brush station, e.g., the track and other parts and assemblies, such that there is no undesirable contact between the wafers and such mechanical components of the brush station as the wafers move along the wafer transfer path.

Once the pre-process adjustments have been made and the processing of wafers begins, an operator can watch a wafer as it moves along the wafer transfer path and see whether any undesirable contact occurs between the top side of the wafer and mechanical components of the brush station. Unfortunately, however, the operator cannot see whether any undesirable contact occurs between the bottom side of the wafer and mechanical components of the brush station because the operator cannot see through the opaque wafer. Consequently, the operator has no reliable way of confirming that the wafer transfer path is unobstructed as far as the bottom side of the wafer is concerned. Thus, at present, it is difficult to control wafer contamination on the bottom side of the wafer in a brush station.

Another way that wafers can be exposed to particulate contamination is through contact with the carriage conveyor as the wafers are being transferred into and out of a SRD station. During this transfer process, a carriage conveyor must be moved just below the bottom side of the wafer. If the pre-process adjustments to the carriage conveyor and the SRD station are not sufficiently precise, then the carriage conveyor may contact the bottom side of the wafer and introduce particulate contamination. As the wafer is being transferred into and out of the SRD station, an operator has no reliable way of determining whether the carriage conveyor is coming into contact with the bottom side of the wafer because the opaque wafer blocks the operator's view of the carriage conveyor. Thus, at present, it is difficult to control wafer contamination on the bottom side of the wafer as the wafer is transferred into and out of the SRD station.

Figure 1B:
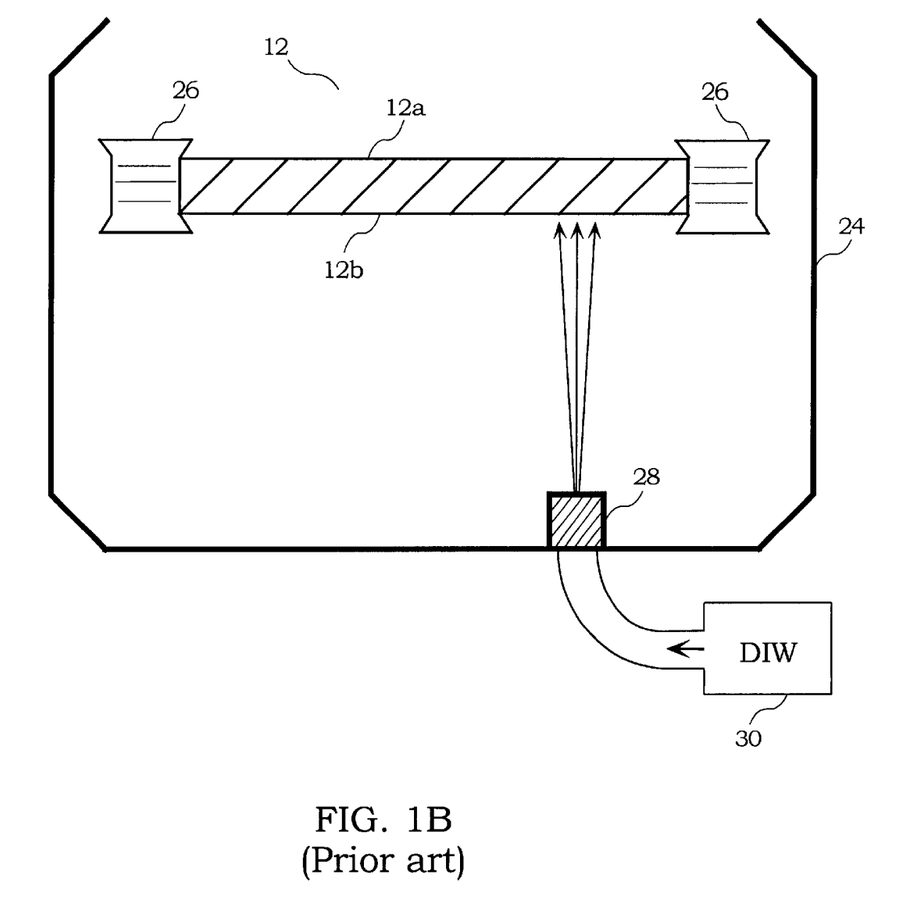
FIG. 1B is a simplified schematic cross-section illustrating the conventional technique used to spray deionized (DI) water on the bottom side of a wafer in a spin, rinse, dry (SRD) station.

In addition to the scrubbing operations described above, current efforts to avoid particulate contamination on wafers also include a number of rinsing operations. In particular, upper and lower rinse manifolds, which are typically located at the entrance to the first brush box and the exits from the first and second brush boxes in the brush station, spray DI water on the top and bottom sides of wafers, respectively. The top and bottom sides of wafers also are sprayed with DI water during the spin rinsing operation performed in the SRD station. FIG. 1B is a simplified schematic crosssection illustrating the conventional technique used to spray DI water on the bottom side of a wafer in the SRD station. As shown therein, wafer 12 is supported in bowl 24 by rollers 26, which contact the edge of the wafer to avoid introducing contaminants to either top side 12a or bottom side 12b of the wafer. A nozzle 28, which is coupled in flow communication with source 30 of DI water, is positioned at the bottom of bowl 24. As wafer 12 is spun, nozzle 28 sprays DI water toward the bottom side 12b of the wafer.

In each of the foregoing rinsing operations, an operator can readily determine whether the spray of DI water is properly contacting the top side of the wafer by merely observing the wafer. The operator, however, has no reliable way of determining whether the spray of DI water is properly contacting the bottom side of the wafer because the opaque wafer blocks the operator's view of the spray. For example, as shown in FIG. 1B, wafer 12 blocks the operator's view of the spray of DI water from nozzle 28 during the spin rinsing operation. Similarly, the wafer blocks the operator's view of the spray of DI water from the lower rinse manifolds in the brush station. In the event the spray of DI water does not properly contact the bottom side of a wafer in any of the foregoing rinsing operations, then the rinsing operation may not thoroughly remove particulate contamination from the bottom side of the wafer. If the amount of particulate contamination on the bottom side of the wafer exceeds acceptable levels, then the yield rate may be decreased significantly.

In view of the foregoing, there is a need for a reliable technique for determining whether the pre-process adjustments to a wafer cleaning system are sufficient to avoid undesirable contact between wafers to be processed and mechanical components of the system. There is also a need for a reliable technique for confirming that the bottom side of a wafer is being adequately contacted with liquid, e.g., DI water, during rinsing operations.

SUMMARY OF THE INVENTION

Broadly speaking, the present invention provides a substantially transparent wafer that may be used to observe, test, and validate adjustments made to wafer cleaning equipment before running in-process semiconductor wafers through such equipment. The substantially transparent wafer may be used to confirm that the wafer transfer path is unobstructed and to confirm that liquid sprayed from below the wafer during rinsing operations properly contacts the bottom side of the wafer.

In accordance with one aspect of the present invention, a method for validating pre-process adjustments to a wafer cleaning system is provided. This method includes the operations of (a) making pre-process adjustments to a wafer cleaning system, (b) loading a substantially transparent wafer into the wafer cleaning system, and (c) observing the substantially transparent wafer as the substantially transparent wafer moves along a wafer transfer path in the wafer cleaning system. In the event undesirable contact between the substantially transparent wafer and components of the wafer cleaning system is observed, the method preferably further includes (d) making adjustments to the wafer cleaning system formulated to avoid undesirable contact between semiconductor wafers to be processed and components of the wafer cleaning system, and (e) repeating operations (b) through (d) until the substantially transparent wafer moves along the wafer transfer path without undesirable contact with components of the wafer cleaning system.

In one embodiment of the invention, the wafer transfer path extends from a first brush box to a second brush box and from the second brush box to a spin, rinse, and dry (SRD) station. In this embodiment, the substantially transparent wafer preferably has a thickness that is larger than a thickness of a semiconductor wafer to be processed in the wafer cleaning system.

In the case in which the wafer cleaning system is a brush station, the substantially transparent wafer may be observed as the wafer moves along the wafer transfer path from the entrance to the first brush box to an exit from the second brush box to confirm that there is no undesirable contact between the wafer and components of the brush station. In this case the method also may include the use of the substantially transparent wafer to confirm that liquid, e.g., DI water, sprayed from the bottom rinse manifolds in the first and second brush boxes properly contacts the bottom side of the wafer. In the case in which the wafer cleaning station is a SRD station, the substantially transparent wafer may be observed as the wafer moves along a wafer transfer path into and out of the SRD station to confirm that there is no undesirable contact between the wafer and components of the carriage conveyor. In this case the method also may include the use of the substantially transparent wafer to confirm that liquid, e.g., DI water, sprayed from a bottom nozzle of a spin bowl properly contacts the bottom side of the wafer.

The present invention enables a wafer cleaning system operator to determine reliably whether the pre-process adjustments to the system are sufficient to avoid undesirable contact between wafers to be processed and components of the system and to confirm that proper adjustments, e.g., adjustments to the orientation of the spray nozzle, are made. This advantageously serves to increase yield rate by significantly reducing or avoiding the introduction of particulate contamination to the wafers, particularly the bottom side of the wafers. The present invention also enables a wafer cleaning system operator to confirm that the bottom side of a wafer is being properly contacted with liquid during rinsing operations. This also serves to increase yield rate by ensuring that the bottom side of the wafers is being thoroughly rinsed to remove particulate contamination.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

The present preferred embodiments of the invention will now be described in detail with reference to the accompanying drawings. FIGS. 1A and 1B are discussed above in the "Background of the Invention" section.

The present invention provides, among other things, a substantially transparent wafer that may be used to observe, test, and validate adjustments made to wafer cleaning equipment before running in-process semiconductor wafers through such equipment. As used in connection with the description of the invention, the phrase "substantially transparent wafer" means a wafer that transmits enough light so that objects or images on one side of the wafer can be seen from the other side of the wafer. The substantially transparent wafer is preferably formed of polycarbonate; however, other suitable materials, e.g., acrylics and glass, also may be used. When polycarbonate is used, the substantially transparent wafer may be fabricated by machining a blank sheet. When materials other than polycarbonate are used, it will be apparent to those skilled in the art that the use of other known techniques to fabricate the substantially transparent wafer may be more appropriate.

The dimensions of the substantially transparent wafer may be varied to suit the needs of particular applications. When the substantially transparent wafer is to be used to determine whether a wafer transfer path is obstructed, the thickness of the substantially transparent wafer is preferably greater than the thickness of the semiconductor wafers to be processed, for reasons that will become apparent later. In one embodiment, the thickness of the substantially transparent wafer is about 0.060 inch. In contrast, the thickness of a standard semiconductor wafer is about 0.028 inch. In this embodiment, the other dimensions of the substantially transparent wafer may be the same as the dimensions of the semiconductor wafers to be processed, e.g., 8-inch diameter. In other applications, it may be desirable to make the substantially transparent wafer thinner than a standard semiconductor wafer.

Figure 2:
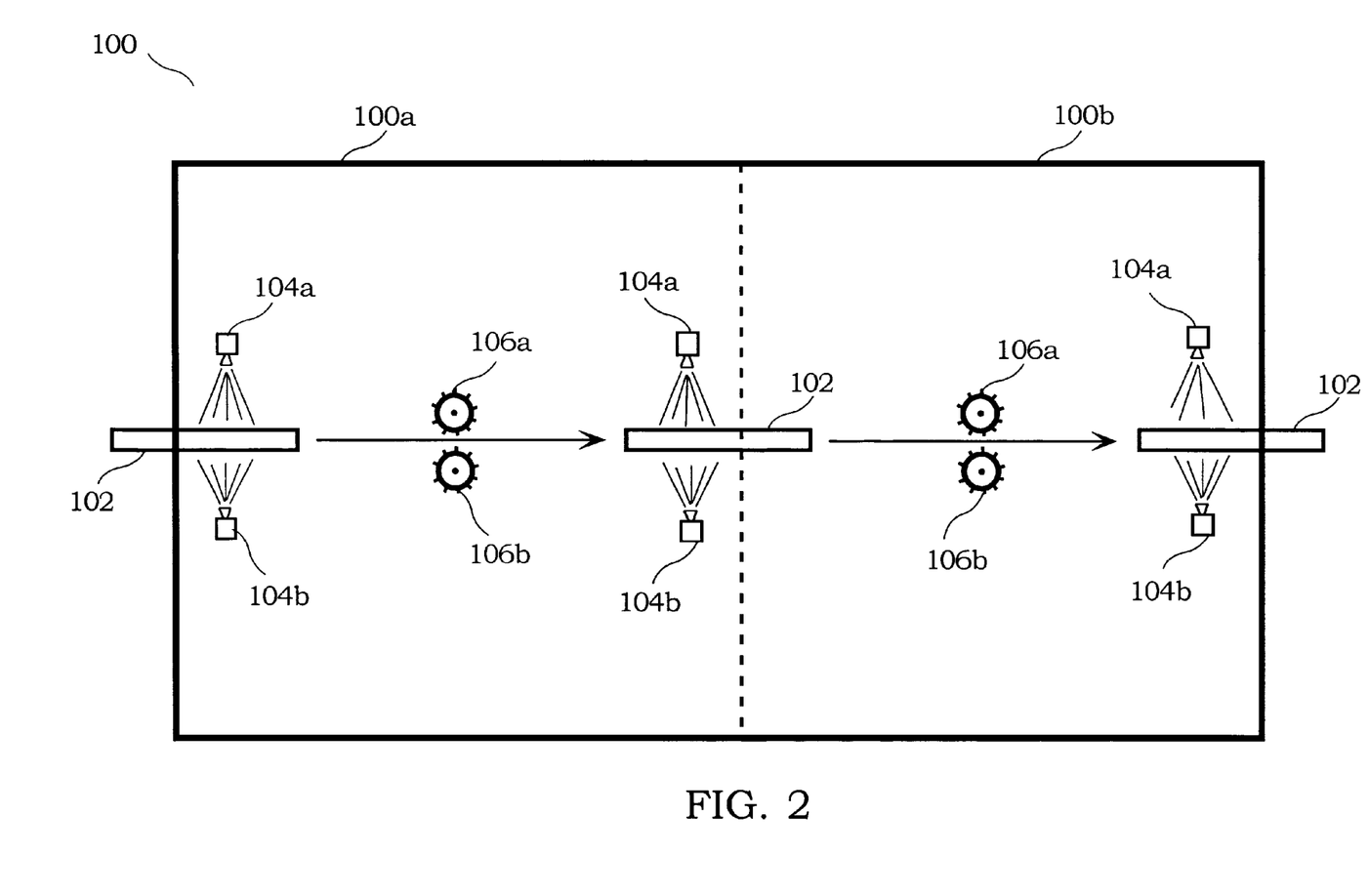
FIG. 2 is a simplified schematic diagram of a brush station that illustrates the manner in which the substantially transparent wafer may be used to inspect visually the transport of a wafer along the wafer transfer path in a brush station.

FIG. 2 is a simplified schematic diagram of a brush station that illustrates the manner in which the substantially transparent wafer may be used to inspect visually the transport of a wafer along the wafer transfer path in a brush station. As shown in FIG. 2, brush station 100 includes first brush box 100a and second brush box 100b. Initially, an operator may look through substantially transparent wafer 102 to see whether the bottom side of the wafer contacts the cassette or any of the surrounding fixtures as the wafer is being loaded from the input station (not shown) into brush station 100. Thereafter, as substantially transparent wafer 102 moves along the wafer transfer path in brush station 100, an operator may look through substantially transparent wafer 102 to see whether the bottom side of the wafer comes into contact with anything other than the rubber band-type conveyor belt on which the wafer rests. For example, in the event the pre-process adjustments to the brush station are not sufficiently precise, the bottom side of the wafer may come into contact with components of the brush station. As used in connection with the description of the invention, the term "components" refers to the mechanical components, parts, and assemblies and the electrical components, parts, and assemblies of a wafer cleaning system, e.g., the sensor cable and roller truck mechanism.

If contact between the bottom side of substantially transparent wafer 102 and any of the components of the brush station is observed, then appropriate adjustments to the brush station may be made to provide an unobstructed wafer transfer path before the processing of semiconductor wafers begins. Once the brush station has been adjusted so that the substantially transparent wafer moves along the wafer transfer path without any undesirable contact with components thereof, the processing of semiconductor wafers may begin without significant risk of introducing particulate contamination to the bottom side of the wafers through such contact.

As substantially transparent wafer 102 moves through first brush box 100a and second brush box 100b, an operator also may observe whether brushes 106a and 106b in the first brush box 100a and the second brush box 100b are operating properly. In addition, an operator may observe whether the top and bottom rinse manifolds 104a and 104b at the entrance to and exit from brush box 100a and the exit from brush box 100b are operating properly. In particular, an operator may look through substantially transparent wafer 102 to confirm that the liquid, e.g., DI water, sprayed from bottom rinse manifolds 104b properly contacts the bottom side of the wafer. If the liquid sprayed from bottom rinse manifolds 104b does not properly contact the bottom side of substantially transparent wafer 102, then appropriate adjustments may be made to the bottom rinse manifolds, the liquid supply system, or both. Once appropriate adjustments have been made so that liquid sprayed from bottom rinse manifolds 104b properly contacts the bottom side of substantially transparent wafer 102, the processing of semiconductor wafers may begin without significant risk that the bottom side of such wafers will be rinsed inadequately in the brush station.

Figure 3A:
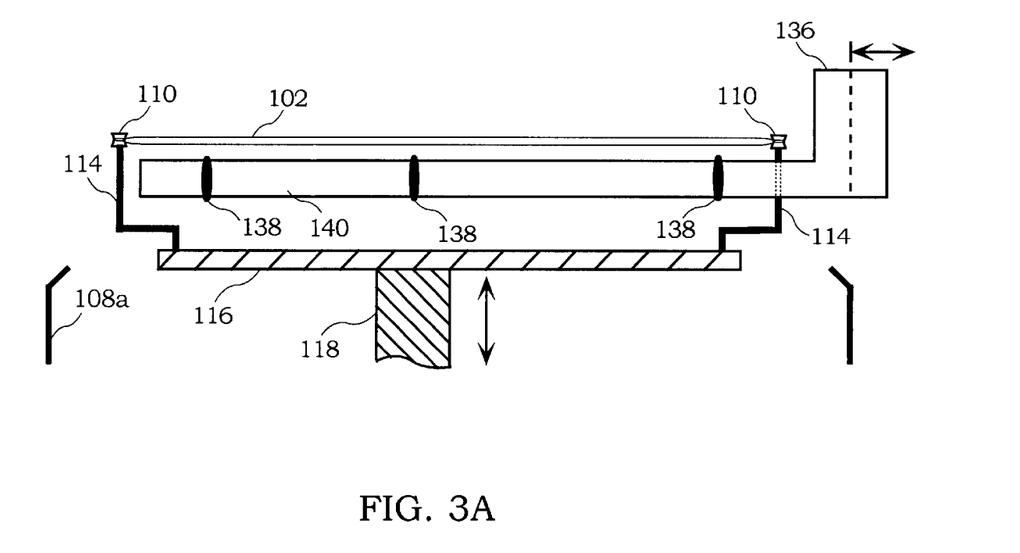
FIGS. 3A to 3C are simplified schematic diagrams that illustrate the manner in which the substantially transparent wafer may be used to inspect visually the transfer of a wafer from a carriage conveyor to a SRD station.
Figure 3B:
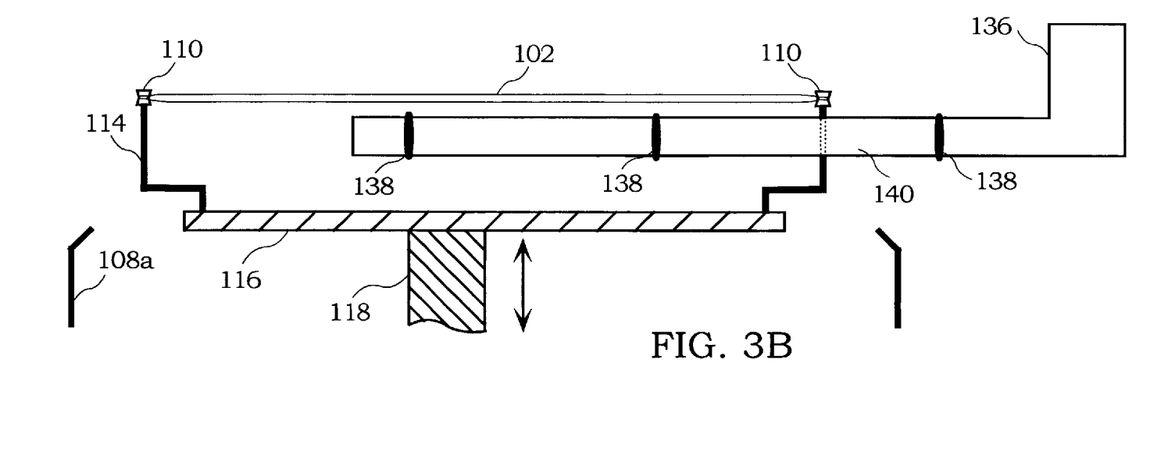
Figure 3C:
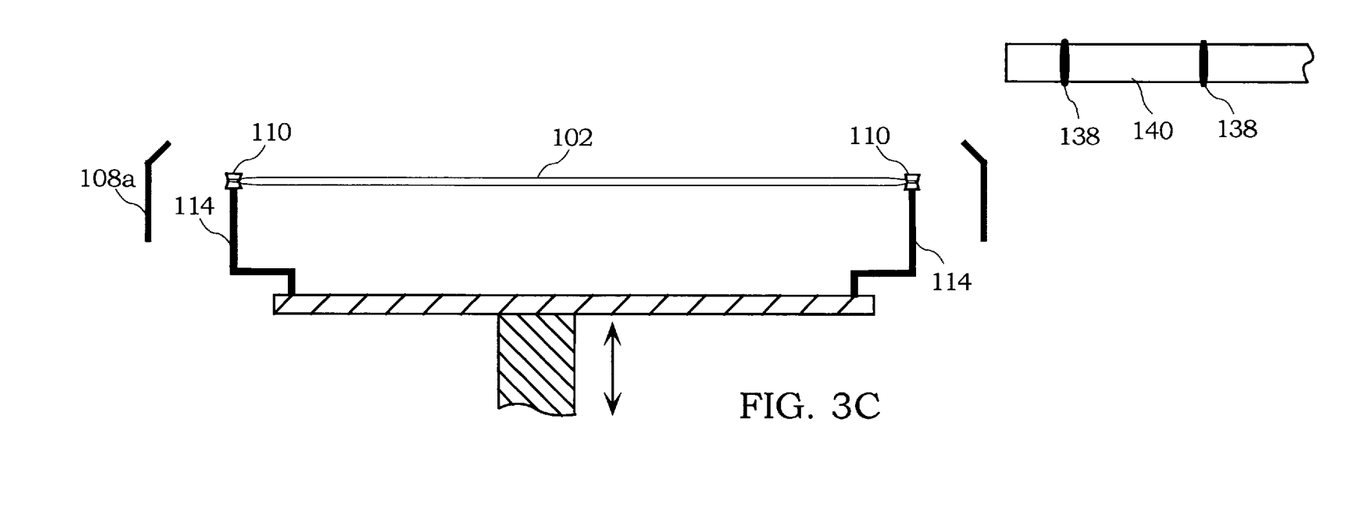

FIGS. 3A to 3C are simplified schematic diagrams that illustrate the manner in which the substantially transparent wafer may be used to inspect visually the transfer of a wafer from a carriage conveyor to a spin, rinse, and dry (SRD) station. To avoid the introduction of undesirable particulate contamination, skidding or other contact between the carriage conveyor and the bottom side of the wafer should be avoided as the conveyor moves out from under the wafer during the transfer process. FIG. 3A shows the position of spindle carriage 136 just after rollers 110 have picked up substantially transparent wafer 102 from rubber band-type O-rings 138 disposed on the rollers of carriage conveyor 140. Before spindle carriage 136 was moved into the position shown in FIG. 3A, shaft 118 was used to raise spindle handle 116 from its original position such that rollers 110 are above the top of sidewall 108 of a spin bowl. Once rollers 110 have picked up substantially transparent wafer 102, spindle carriage 136 is retracted to its original position.

FIG. 3B shows spindle carriage 136 in a partially retracted position. As spindle carriage 136 is being retracted, an operator can look through substantially transparent wafer 102 for signs of skidding or other contact between carriage conveyor 140 and the bottom side of the wafer. If skidding or other contact with substantially transparent wafer 102 is observed, then appropriate adjustments may be made to the carriage conveyor, the SRD station, or both before the processing of semiconductor wafers begins. Once appropriate adjustments have been made so that the carriage conveyor does not contact the substantially transparent wafer, the processing of semiconductor wafers may begin without significant risk of introducing particulate contamination to the bottom side of the semiconductor wafers during the transfer process. As shown in FIG. 3C, once spindle carriage 136 is fully retracted, shaft 118 lowers spindle handle 116 back to its original position for a spin rinsing operation.

Figure 4:
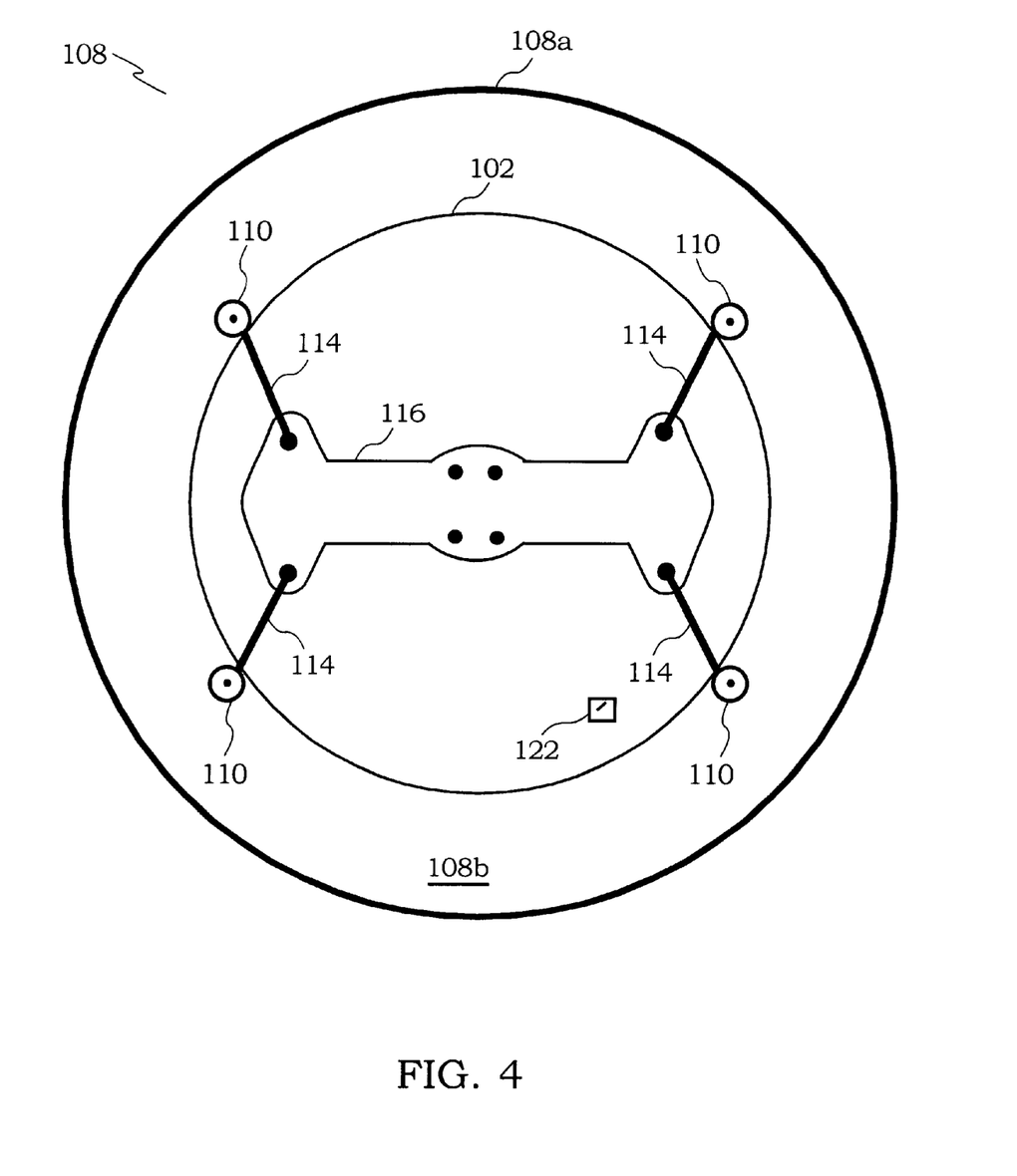
FIG. 4 is a simplified top view of a SRD station that illustrates the manner in which the substantially transparent wafer may be used to confirm that the bottom side of the wafer is be properly rinsed during a spin rinsing operation.

FIG. 4 is a simplified top view of a SRD station that illustrates the manner in which the substantially transparent wafer may be used to confirm that the bottom side of the wafer is be properly rinsed during a spin rinsing operation. As shown in FIG. 4, substantially transparent wafer 102 is supported within spin bowl 108, which has sidewall 108a and bottom wall 108b. More particularly, four rollers 110, each of which is mounted on one of fingers 114, support substantially transparent wafer 102 above spindle handle 116. Bottom nozzle 122 is mounted on bottom wall 108b to spray liquid, e.g., DI water, on the bottom side of wafers disposed in spin bowl 108. During the spin rinsing operation, an operator can look through substantially transparent wafer 102 to confirm that liquid sprayed from bottom nozzle 122 properly contacts the bottom side of the wafer. If the liquid sprayed from bottom nozzle 122 does not properly contact the bottom side of substantially transparent wafer 102, then appropriate adjustments may be made to the SRD station, the liquid supply system, or both. Once appropriate adjustments have been made so that liquid sprayed from bottom nozzle 122 properly contacts the bottom side of substantially transparent wafer 102, the processing of semiconductor wafers may begin without significant risk that the bottom side of such wafers will be rinsed inadequately during the spin rinsing operation.

Figure 5:
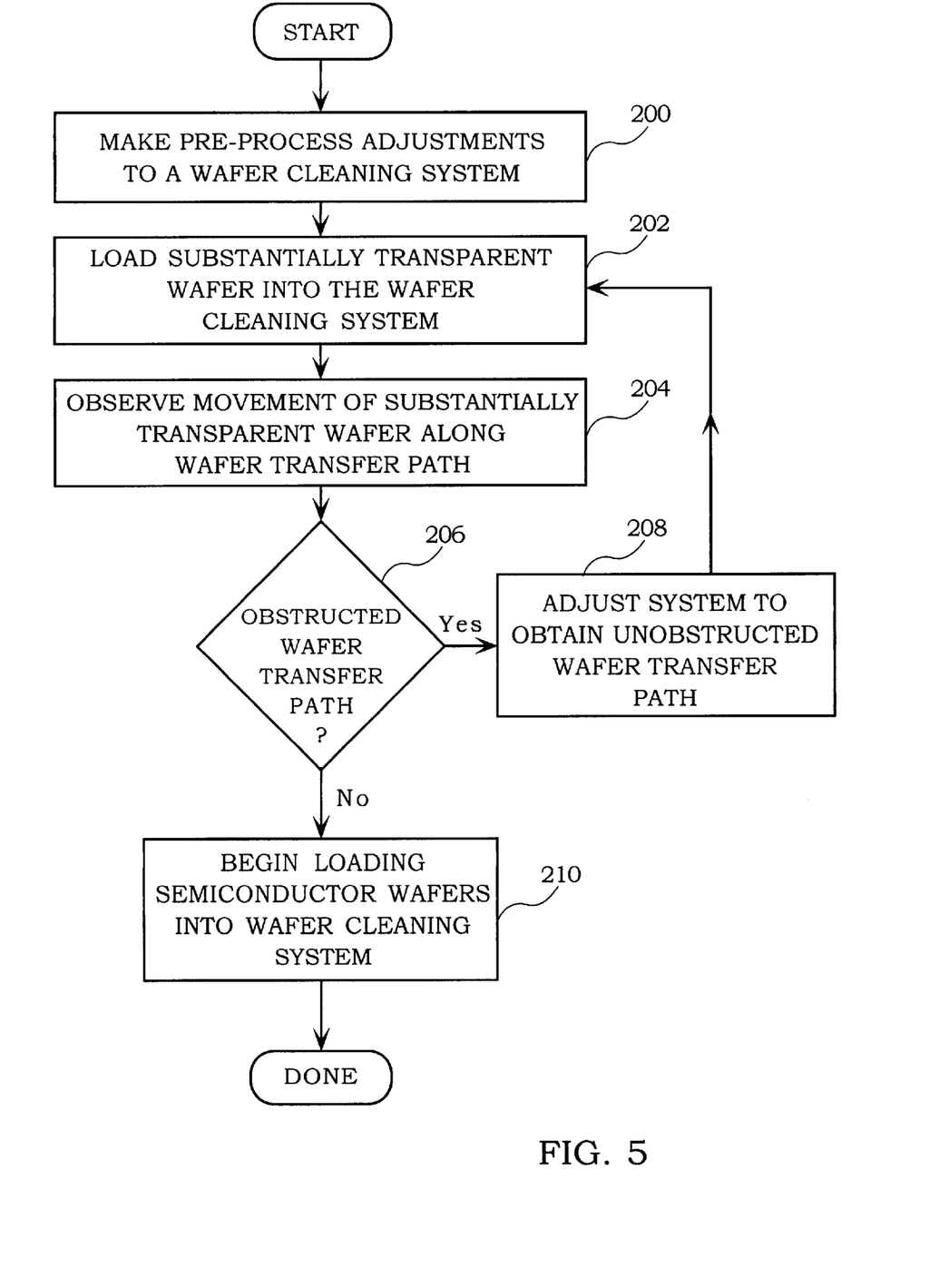
FIG. 5 shows a flowchart diagram illustrating the method operations performed in validating pre-process adjustments to a wafer cleaning system in accordance with one embodiment of the present invention.

FIG. 5 shows a flowchart diagram illustrating the method operations performed in validating pre-process adjustments to a wafer cleaning system in accordance with one embodiment of the present invention. The method begins in operation 200 in which pre-process adjustments are made to a wafer cleaning system, e.g., a brush station or a SRD station. As is well known to those skilled in the art, such adjustments are formulated to provide an unobstructed wafer transfer path through the wafer cleaning system so that in-process semiconductor wafers can travel through the system without undesirable contact with components of the system. As described above, such contact is undesirable because it can introduce particulate contamination to the wafer. In operation 202 a substantially transparent wafer is loaded into the wafer cleaning system. In operation 204 the substantially transparent wafer is observed as it moves along the wafer transfer path in the cleaning system.

The method then proceeds to decision operation 206 in which it is determined whether the wafer transfer path is obstructed. If the wafer moves along the wafer transfer path without undesirable contact between either the top or bottom side of the wafer and components of the wafer cleaning system, then the wafer transfer path is unobstructed and the method proceeds to operation 210. On the other hand, if either the top or bottom side of the wafer contacts components of the wafer cleaning system along the wafer transfer path, then the wafer transfer path is obstructed and the method proceeds to operation 208. In operation 208 the wafer cleaning system is appropriately adjusted to obtain an unobstructed wafer transfer path. For example, it may be necessary to adjust the height of the rollers so that wafer is held slightly above, and therefore does not touch, the conveyor track in a brush station. Once the wafer cleaning system is adjusted to avoid contact between the wafer and components of the system, the method returns to operation 202 so that operations 202, 204, and 206 may be repeated.

Once it is determined in operation 206 that the wafer transfer path is unobstructed, the method proceeds to operation 210. In operation 210 the loading of in-process semiconductor wafers into the wafer cleaning system begins and the method is done. Absent unusual circumstances, the in-process semiconductor wafers will move along the wafer transfer path without contacting components of the wafer cleaning system because the pre-process adjustments have been previously validated using the substantially transparent wafer. In one embodiment, the thickness of the substantially transparent wafer is greater than that of a standard semiconductor wafer to ensure that there is more clearance between the wafer and components of the wafer cleaning system than is actually necessary for an unobstructed wafer transfer path. The use of the substantially transparent wafer enables an operator to see through the wafer and visually confirm that no undesirable contact between the bottom side of the wafer and components of the wafer cleaning system is occurring as the wafer moves along the wafer transfer path. In this manner the introduction of particulate contamination to in-process semiconductor wafers caused by such contact may be avoided.

In one embodiment, the wafer cleaning system is a brush station. In this embodiment the substantially transparent wafer may be observed as the wafer moves along the wafer transfer path from the entrance to the first brush box to an exit from the second brush box to confirm that there is no undesirable contact between the wafer and components of the brush station. In this embodiment the method also may include the use of the substantially transparent wafer to confirm that liquid, e.g., DI water, sprayed from the bottom rinse manifolds in the first and second brush boxes properly contacts the bottom side of the wafer. In another embodiment, the wafer cleaning station is a SRD station. In this embodiment the substantially transparent wafer may be observed as the wafer moves along a wafer transfer path into and out of the SRD station to confirm that there is no undesirable contact between the wafer and components of the carriage conveyor. In this embodiment the method also may include the use of the substantially transparent wafer to confirm that liquid, e.g., DI water, sprayed from a bottom nozzle of a spin bowl properly contacts the bottom side of the wafer.

In summary, the present invention provides a substantially transparent wafer that may be used to validate pre-process adjustments to a wafer cleaning system and to confirm that proper adjustments, e.g., adjustments to the orientation of the spray nozzle, are made. The invention has been described herein in terms of several preferred embodiments. Other embodiments of the invention will be apparent to those skilled in the art from consideration of the specification and practice of the invention. For example, in one embodiment described herein the entire wafer is formed of a substantially transparent material. It will be apparent to those skilled in the art that wafers partially formed of a substantially transparent material, e.g., a wafer with one or more substantially transparent windows, also may be used. The embodiments and preferred features described above should be considered exemplary, with the invention being defined by the appended claims.

What is claimed is:

1. A method for validating pre-process adjustments to a wafer cleaning system, comprising:
    (a) making pre-process adjustments to a wafer cleaning system;
    (b) loading a substantially transparent wafer into said wafer cleaning system;
    (c) observing said substantially transparent wafer as said substantially transparent wafer moves along a wafer transfer path in said wafer cleaning system;
    (d) wherein in the event undesirable contact between the substantially transparent wafer and components of the wafer cleaning system is observed, making adjustments to the wafer cleaning system formulated to avoid undesirable contact between semiconductor wafers to be processed and components of the wafer cleaning system; and
    (e) repeating operations (b) through (d) until the substantially transparent wafer moves along the wafer transfer path without undesirable contact with components of the wafer cleaning system.

2. The method of claim 1, wherein the wafer cleaning system comprises a brush station.

3. The method of claim 2, wherein the wafer transfer path extends from a first brush box to a second brush box.

4. The method of claim 3, wherein the wafer cleaning system further includes a spin, rinse, and dry (SRD) station.

5. The method of claim 4, wherein the wafer transfer path further extends from the second brush box to the spin, rinse, and dry (SRD) station.

6. The method of claim 1, wherein the substantially transparent wafer has a thickness that is larger than a thickness of a semiconductor wafer to be processed in the wafer cleaning system.

7. A method for validating pre-process adjustments to a brush station, comprising:
    (a) making pre-process adjustments to a brush station having a first brush box and a second brush box;
    (b) loading a substantially transparent wafer into an entrance to said first brush box;
    (c) observing said substantially transparent wafer as said substantially transparent wafer moves along a wafer transfer path from said entrance to said first brush box to an exit from said second brush box;

(d) wherein in the event undesirable contact between the substantially transparent wafer and components of the brush station is observed, making adjustments to the brush station formulated to avoid undesirable contact between semiconductor wafers to be processed and components of the brush station; and (e) repeating operations (b) through (d) until the substantially transparent wafer moves along the wafer transfer path without undesirable contact with components of the brush station.

8. The method of claim 7, wherein the substantially transparent wafer has a thickness that is larger than a thickness of a semiconductor wafer to be processed in the brush station.

9. The method of claim 7, wherein each of the first and second brush boxes has a bottom rinse manifold for spraying liquid on a bottom side of a semiconductor wafer, and in the event liquid sprayed from any of said bottom rinse manifolds does not properly contact the bottom side of the substantially transparent wafer, the method further comprises:

(f) making adjustments to said bottom rinse manifolds or a liquid supply system formulated to bring liquid sprayed from said bottom rinse manifolds into proper contact with the bottom side of semiconductor wafers to be processed; and (g) repeating operations (b), (c), and (f) until liquid sprayed from said bottom rinse manifolds properly contacts the bottom side of the substantially transparent wafer.

10. The method of claim 9, wherein the liquid is deionized (DI) water.

11. A method for validating pre-process adjustments to a spin, rinse, and dry (SRD) station, comprising:

(a) making pre-process adjustments to a SRD station and a carriage conveyor for transferring semiconductors wafers to be processed into said SRD station;

(b) transferring a substantially transparent wafer into and out of said SRD station with said carriage conveyor;

(c) observing said substantially transparent wafer as said substantially transparent wafer moves along a wafer transfer path into and out of said SRD station;

(d) wherein in the event undesirable contact between the substantially transparent wafer and components of the carriage conveyor is observed, making adjustments to at least one of the SRD station and the carriage conveyor formulated to avoid undesirable contact between semiconductor wafers to be processed and components of the carriage conveyor; and (e) repeating operations (b) through (d) until the substantially transparent wafer moves along the wafer transfer path without undesirable contact with components of the carriage conveyor.

12. The method of claim 11, wherein the substantially transparent wafer has a thickness that is larger than a thickness of a semiconductor wafer to be processed in the SRD station.

13. The method of claim 11, wherein the method further comprises:

(f) observing the substantially transparent wafer during a spin rinsing operation to confirm that liquid sprayed from a bottom nozzle of a SRD station bowl properly contacts a bottom side of the substantially transparent wafer.

14. The method of claim 13, wherein in the event the liquid sprayed from the bottom nozzle does not properly contact the bottom side of the substantially transparent wafer, the method further comprises:

(g) making adjustments to the SRD station or a liquid supply system formulated to bring liquid sprayed from the bottom nozzle into proper contact with the bottom side of semiconductor wafers to be processed; and (h) repeating operations (f) and (g) until liquid sprayed from the bottom nozzle properly contacts the bottom side of the substantially transparent wafer.

15. The method of claim 13, wherein the liquid is deionized (DI) water.

* * * * *